United States Patent [19]

Lee

[11] Patent Number: 5,001,774
[45] Date of Patent: Mar. 19, 1991

[54] STEREO HEADPHONE REMOTE CONTROL CIRCUIT

[75] Inventor: Kyu-An Lee, Suwon, Rep. of Korea

[73] Assignee: SamSung Electronics Co., Ltd., Suweon, Rep. of Korea

[21] Appl. No.: 395,506

[22] Filed: Aug. 18, 1989

[30] Foreign Application Priority Data

Aug. 23, 1988 [KR] Rep. of Korea .................. 88-10715

[51] Int. Cl.$^5$ .............................................. H04B 1/06
[52] U.S. Cl. .................................. 455/151; 455/352; 381/25; 358/194.1
[58] Field of Search ............... 455/352, 355, 151, 353; 358/194.1; 381/25, 85, 105, 74; 341/176

[56] References Cited

U.S. PATENT DOCUMENTS

| | | | |
|---|---|---|---|
| 3,714,579 | 1/1973 | Valdes et al. | 455/355 |
| 4,375,651 | 3/1983 | Templin et al. | 455/180 |
| 4,433,209 | 2/1984 | Kurosawa et al. | 381/25 |
| 4,549,179 | 10/1985 | Stenardo | 381/85 |
| 4,807,052 | 2/1989 | Amano | 358/194.1 |
| 4,829,571 | 5/1989 | Kakiuchi et al. | 381/25 |
| 4,845,751 | 7/1989 | Schwab | 455/151 |

Primary Examiner—Reinhard J. Eisenzopf
Assistant Examiner—Lisa Charouel
Attorney, Agent, or Firm—Robert E. Bushnell

[57] ABSTRACT

A remote control circuit for remotely controlling a power source and a volume of a main set from a stereo-headphone composed of a remote control transmitting circuit arranged in a headphone, and a remote control receiving circuit arranged in a mainset.

9 Claims, 2 Drawing Sheets

AN EQUIVALENT CIRCUIT WHEN Q₁ IS ON

AN EQUIVALENT CIRCUIT WHEN Q₁ IS OFF 5,001,774

STEREO HEADPHONE REMOTE CONTROL CIRCUIT

BACKGROUND OF THE INVENTION

The present invention relates generally to a remote control circuit which is used in a stereo cassette and a type of amplifier sounder and, more particularly, to a remote control circuit for remotely controlling a power source and a volume of a main set from a stereo headphone.

In most stereo amplifier sounders, it is known that the sound volume is controlled from a main machinery when we are listening with headphones.

As is well known in the art, although the headphone itself has a volume, the main set volume is separately operated when a volume of a mainset is lowest, the main power is not operated from a headphone and is manually operated.

In U.S. Pat. No. 4,435,844 there is disclosed a remote control circuit which minimizes a voltage dropped from a remote control unit. Furthermore, this art doesn't remotely control a power source but directly controls main power.

SUMMARY OF THE INVENTION

The invention accordingly includes 4 terminal-type headphones which added one terminal from prior 3 terminal-type headphones, an additional terminal controls a power source and volume of a main set. A circuit which performs such a function is arranged in a headphone, said circuit provides a remote control circuit arranged in a power switching section and a volume impedance control section of a mainset.

The principal object of the invention is the device of an improved remote control circuit for remotely controlling power source and volume of a main set from a stereo-headphone.

With this object in view, the invention is a remote control circuit of the sounder using a stereo-headphone including an on-off headphone switch SW1 for main power so as to remotely control power and volume of a mainset from a headphone; the variable resistors VR1, VR2 for controlling the volume of the left-right headphone; a 4 terminal-type headphone jack associated with the connection terminal of the switch SW1 and other connection terminals a, b, d of the variable resistors VR1, VR2; a jack holder 200 associated with the connection jack of the headphone; the switching transistors Q3, Q4 for controlling a power source supplying a power to a mainset by switching actuation according to the operation of the on-off headphone switch SW1 for main power; the volume impedance control transistors Q1, Q2 for switching a volume impedance through a main amplifier when the volume control variable resistors of a headphone or the volume control variable resistors arranged in a mainset are operated; and a switch SW2 for operating a main set by remote or normal control.

A preferred embodiment of the invention will now be described, by way of example only, with reference to the accompanying drawings, in which:

DETAILED DESCRIPTION OF THE PREFERRED EMBODIMENT

Figure 1:
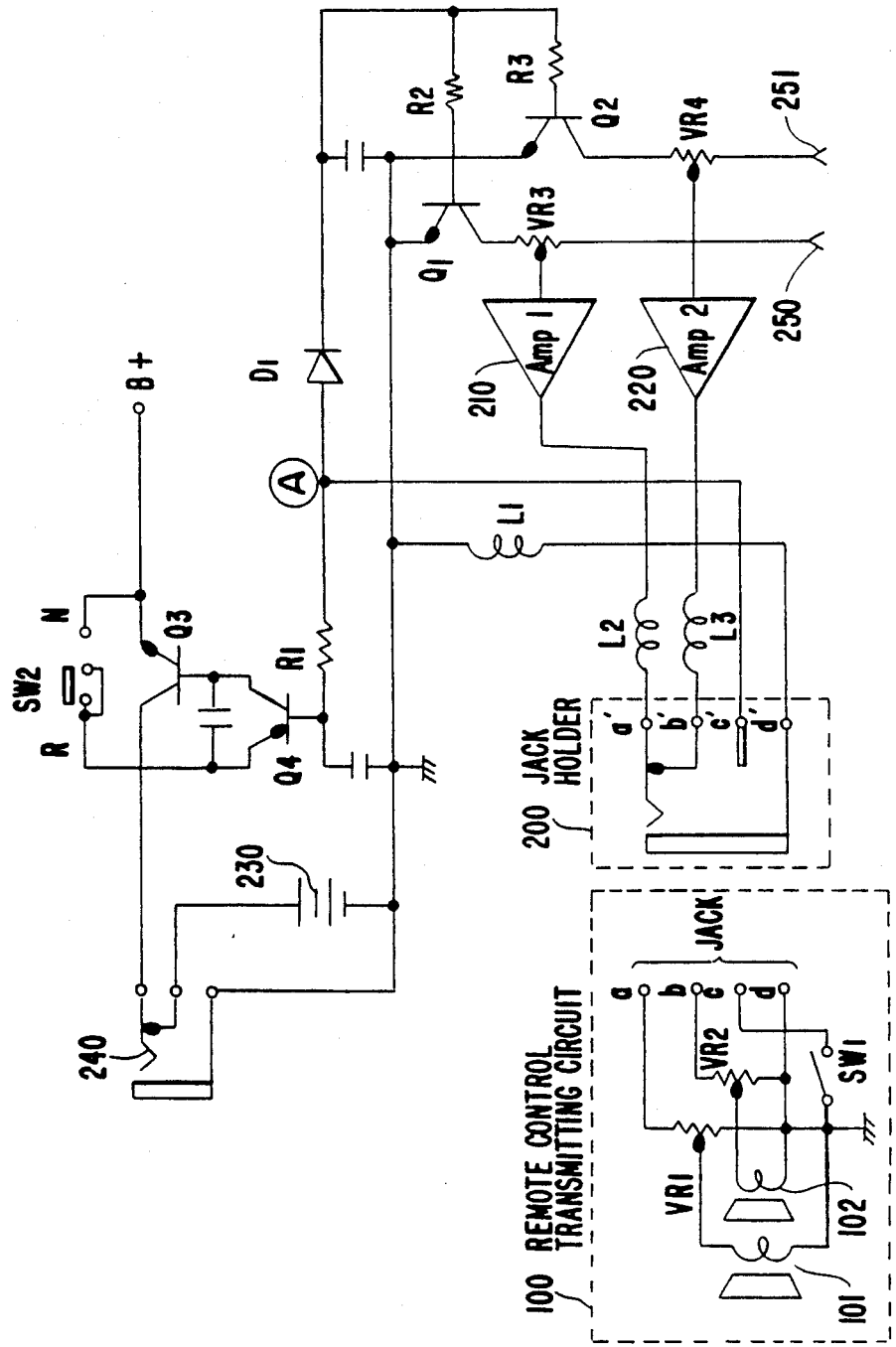
FIG. 1 is a ciruit diagram of one embodiment the invention.

Referring now to the drawings, and particularly to FIG. 1, the circuit diagram of the invention illustrated therein is composed of a remote control circuit for transmitting arranged in a headphone, and a remote control circuit for receiving transmissions from the headphone arranged in a mainset.

The remote control transmitting circuit 100 is composed of the volume control variable resistors VR1, VR2 connected to the left-right headphone speakers 101, 102, the power on-off switch SW1 connected to the common connection terminal of the variable resistors VR1, VR2, and A 4 terminal-type headphone connection jack consisting of other side coupling terminals a, b, d of the variable resistor VR1, VR2 and the coupling terminal c of the switch SW1.

The remote control receiving circuit is composed of a jack holder 200 connected to the headphone connection jack, main amplifiers 210, 220 connected to respective coils L2, L3 through the terminals a', b' of the jack holder 200, the volume control variable resistors VR3, VR4 modulating left-right sound signals 250, 251, the transistors Q1, Q2 adjusting the impedance of the variable resistors VR3, VR4, the battery 230 coupling to the D.C. power source coupling terminal 240, and the transistors Q3, Q4 for switching the D.C. power source, the bases of said transistors Q1, Q2 are connected to D.C. power through respective resistors R2, R3. The base of the transistor Q3 is connected to the collector of Q4, the base of Q4 is connected to Q2 through a bias resistor R1 and a diode D1.

Alternatively, the switch SW2 for converting the remote and the normal function is associated with the collector and the emitter of transistor Q3, the terminal c' of the jack holder 200 is associated with the base of Q4 for controlling a power source, the terminal d' is associated with the D.C. power connection jack 240 through coil L1.

Figure 2:
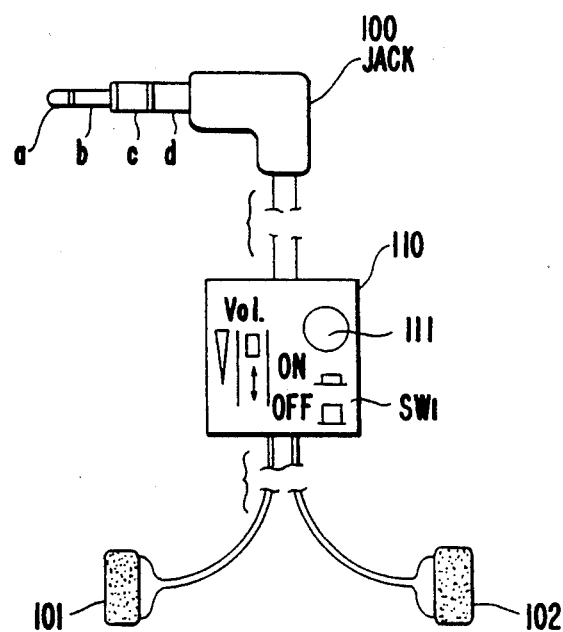
FIG. 2 is a construction view of a headphone jack according to the invention.

FIG. 2 is a schematic diagram of a headphone 100 according to the invention wherein a headphone jack has 4 terminals a, b, c, d and, a remote control 110 is composed of a volume control switch and a power on-off switch SW1 and a luminous diode 111 for displaying the state of on-off power source.

An operation of the present invention will be described with specific reference to FIG. 1 through FIG. 3.

First, in case the mainset is operated through a remote control, the remote or the normal switching device SW2 is set to a remote position R.

At this time, the power source which is supplied from the battery 230 or D.C.-jack is applied to the collector of the transistor Q3 and the emitter of the transistor Q4. Therefore, in case that the A contact associated with the base of Q4 is high voltage, the transistor Q4 is off. Therefore if the base of the transistor Q3 is low, Q3 is off. Accordingly, the main set is not supplied D.C. power source B+.

At this time if the power on-off switch SW1 arranged in a headphone 100 is on, the high voltage of the A contact is grounded through the c contact of the connection jack and the switch SW1. Therefore, the base of the transistor Q4 is applied low voltage, as a result, the transistor Q4 is turned on.

Accordingly, as the transistor Q4 is turned on, the base of Q3 is applied high voltage. Furthermore, as the transistor Q3 is also turn on, the main set is normally supplied the power source.

Alternatively, when the switch SW1 is on and the power B+ is supplied to the main set, the A contact is low, therefore the low potential is applied to the base of transistors Q1, Q2 consequently, the transistors Q1, Q2 are off.

Being turned off the transistors Q1, Q2 adjust the volume with exterior volume control variable resistors VR1, VR2 without relating to the volume control variable resistors VR3, VR4 arranged in a mainset. The volume control variable resistors VR1, VR2 are operated as follows.

Figure 3A:
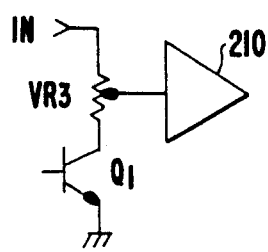
FIGS. 3A, 3B and 3C are partial diagrams taken from FIGS. 1 and 2 equivalent circuit diagrams showing transistor Q1 in ON and OFF states, respectively.
Figure 3B:
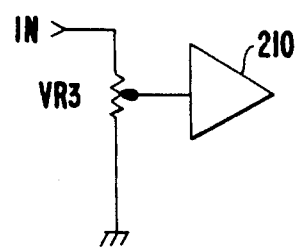
Figure 3C:
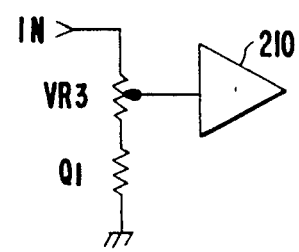

That is, as shown from FIG. 3, if the transistor Q1 is off, the impedance of Q1 is maximum, thus, the input signal of a main amplifier is output as it is without relating to the variable resistor VR3. The reason why the impedance is infinity ∞ when the transistor Q1 is off is that the value (for example, about 10R) of the variable resistor VR3 is neglected. On the other hand, it may be seen that transistor Q2 and variable resistor VR4 are operated in the same manner.

Accordingly, a power can be supplied to a main set by actuation of switch SW1, the sound volume can be controlled by the volume control variable resistors VR1, VR2 without relating to volume control variable resistors VR3, VR4 arranged in a headphone.

In turn, in case that the main set is operated for normal function, the switch SW2 is set on Normal position. If the switch SW2 is on, a power is supplied to a main set without relating to on-off switch SW1, and if the switch SW1 is off, the transistors Q1, Q2 are turned on because the high potential of the A contact is applied to the base of the transistors Q1, Q2. The volume control of a left signal 250 and a right signal 251 is performed by the volume control variable resistors VR3, VR4 arranged in a main set.

The invention improves 3 terminal-type headphone construction and thus arranges interior power control and interior volume impedance control device, and is not only applied to a pocket-stereo sounder but also a radio/cassette. Many modifications and variations of the present invention are possible and it is intended to cover all such as fall within the spirit and scope of the appended claims.

What is claimed is:

1. A remote control circuit, comprising:
an on-off headphone switch for during a first mode, remotely controlling from a headphone, power of a main set, and for shifting control to the headphone of volume of stereophonic audio signals amplified by the main set;
a first plurality of variable resistors for controlling volume in said headphone during said first mode;
a four terminal headphone coupler associated with a common terminal of said headphone switch and other connection terminals for said first plurality of variable resistors;
a second coupler configured to engage and provide electrical connection with said headphone coupler;
switching transistors controlling a power source supplying the power to the main set during said first mode by switching actuation according to the operation of said on-off headphone switch;
volume impedance control transistors for switching control of the volume of the audio signals transmitted by a main amplifier, between said volume controlling first plurality of variable resistors of the headphone and a second plurality of variable resistors for controlling volume arranged in the main set, in dependence upon said headphone switch; and
a second switch coupled to said switching transistors, for switching the main set between said first mode and a second mode.

2. A remote control circuit using a stereo-headphone, comprising:
remote control transmitting means for conducting power and left and right audio signals, including:
a first coupler having four terminals;
variable resistance means attenuating input signals and supplying intermediate signals to a plurality of amplifiers;
said plurality of amplifiers amplifying said intermediate signals and transmitting said left and right audio signals using three terminals of said first coupler;
first and second transistors for modifying the impedance of said variable resistance means;
a power source coupling terminal connected to said first and second transistors;
third and fourth transistors for switching a power source between ON and OFF operational states during a first mode of operation; and
first switching means connected to the collector of said third transistor for converting the circuit from said first to a second mode of operation; and
remote control receiving means including a four terminal headphone coupler, for connecting said receiving means to said transmitting means via said first coupler.

3. A remote control circuit, comprising:
receiving means;
a remote unit;
a first plurality of speakers disposed in said remote unit with one side of each of said speakers electrically coupled to a common connection terminal;
a plurality of variable resistors within said remote unit connected to different ones of said speakers and to said common connection terminal;
a power switch connected to said common connection terminal;
four terminal headphone connection means having a first lead coupled to said common connection terminal via a first one of said variable resistors, a second lead coupled to said common connection terminal via a second one of said variable resistors, a third lead coupled directly to said common connection terminal, and a fourth lead coupled to said common connection terminal via said power switch, for connecting said remote unit with said receiving means.

4. A remote control circuit as claimed in claim 3, wherein said receiving means comprises:
second connection means for providing four terminals, connectable to corresponding ones of said leads of said headphone connection means;
a plurality of amplifiers connected through coils to two terminals of said second connection means;

a second plurality of variable resistors attenuating sound signals and supplying resultant signals to said main amplifiers during a second mode;

first and second transistors for modifying the impedance of said second plurality of variable resistors;

a terminal connectable to a source of power, connected to said first and second transistors;

third and fourth transistors for controlling flow of current, during a first mode, from a source of power connected to said terminal; and a second switch connected to the collector of said third transistor for converting operation of said receiving means from said first mode to said second mode.

5. A method for controlling a main set from a stereo headphone, comprising the steps of:

switching a main set to a first mode;

coupling a remote control unit to the main set;

switching a power switch within said remote control unit to an ON position;

responding to said step of switching to an ON position by supplying power to turn ON a plurality of switching transistors to thereby enable electrical power to flow to the main set, and by disenabling a plurality of volume control stages in said main set from substantially varying amplitudes of right and left audio signals during said first mode;

varying resistance values in said remote control unit to increase or decrease during said first mode the amplitudes of said right and left audio signals from the main set applied to speakers contained in said headphone;

switching the main set between said first mode and a second mode, and thereby enabling said plurality of volume control stages to vary amplitudes of said right and left audio signals during said second mode; and adjusting impedance values of said volume control stages to vary amplitudes of said right and left audio signals during said second mode.

6. A remote control circuit as claimed in claim 1, further comprised of said headphone coupler having a first lead coupled to said common terminal via a first one of said first plurality of variable resistors, a second lead coupled to said common terminal via a second one of said first plurality of variable resistors, a third lead coupled directly to said common terminal, and a fourth lead coupled to said common terminal via said headphone switch.

7. A remote control circuit using a stereo-headphone, comprising:

first switching means disposed between a plurality of speakers of a headphone and a main set transmitting stereophonic signals, for controlling application of power to the main set during a first mode;

variable impedance means disposed between the plurality of speakers and the main set, for controlling volume of audio signals generated by said plurality of speakers in said headphone while the plurality of speakers are driven by said stereophonic signals;

a headphone coupler having four terminals disposed between the plurality of speakers and the main set;

a second coupler coupled to the main set to receive said headphone jack, said second coupler including four terminals, with first terminals of said headphone coupler and second coupler coupling one side of said first switching means to said main set, and with a plurality of terminals of said headphone coupler and second coupler coupling said stereophonic audio signals to said variable impedance means;

power control means coupled between said first terminal of said second coupler and a source of the power, for controlling supply of the power to a main set according to said first switching means;

volume impedance controlling means coupled between said plurality of terminals of said second coupler and a source of said stereophonic signals, for controlling volume of said stereo-phonic signals during a second mode; and second switching means coupled to said switching stage, for switching the main set between said first mode and said second mode.

8. A remote control circuit using a stereo-headphone, comprising:

a headphone jack having a plurality of electrical terminals connectable to a stereo-headphone;

a receptacle having a plurality of leads, for receiving said jack and making electrical connections between said terminals and corresponding ones of said leads;

first switching means coupled between said jack and the stereo-headphone to allow control of power and volume of a main set during a first mode;

left and right speakers contained in the stereo-headphone and coupled to a plurality of terminals of said jack;

a first right variable resistor coupled to the right one of the speakers, for controlling volume in said right speaker during said first mode;

a first left variable resistor coupled to the left one of the speakers, for controlling volume in said left speaker during said first mode;

a second right variable resistor contained in the main set for controlling volume in said right speaker during a second mode;

a second left variable resistor contained in the main set for controlling volume in said left speaker during said second mode;

power controlling means for controlling power to a main set according to the operation of said first switch;

a right main amplifier;

right volume impedance control means, for enabling attenuation of signals transmitted through said right main amplifier to be influenced by one of said first or second right volume control variable resistors;

a left main amplifier;

left volume impedance control means, for enabling attenuation of signals transmitted through said left main amplifier to be influenced by one of said first or second left volume control variable resistors; and second means, for switching the main set between said first and second modes.

9. A control circuit as defined by claim 8, further comprising:

said headphone jack having a first terminal coupled via said first right variable resistor to a common node formed between one side of said first switching means and said first right and first left variable resistors, a second terminal coupled to said common node via said first left variable resistor, a third terminal coupled directly to said common node, and a fourth terminal coupled to said common node via said first switching means.

* * * * *